United States Patent
Kamashita

[19]

[11] Patent Number: 6,020,608
[45] Date of Patent: Feb. 1, 2000

[54] JUNCTION-TYPE FIELD-EFFECT TRANSISTOR WITH IMPROVED IMPACT-IONIZATION RESISTANCE

[75] Inventor: Atsushi Kamashita, Kawasaki, Japan

[73] Assignee: Nikon Corporation, Tokyo, Japan

[21] Appl. No.: 09/013,169

[22] Filed: Jan. 27, 1998

[30] Foreign Application Priority Data

Jan. 27, 1997 [JP] Japan .................................. 9-012364

[51] Int. Cl.$^7$ .......................... H01L 29/80; H01L 31/112
[52] U.S. Cl. ............................................. 257/270; 257/285
[58] Field of Search ..................................... 257/270, 285

[56] References Cited

U.S. PATENT DOCUMENTS

| Re. 34,821 | 1/1995 | Khadder et al. | 257/270 |
|---|---|---|---|
| 5,324,969 | 6/1994 | Murai et al. | 257/279 |
| 5,376,812 | 12/1994 | Oku | 257/279 |

*Primary Examiner*—Ngân V. Ngô
*Attorney, Agent, or Firm*—Klarquist Sparkman Campbell Leigh & Whinston, LLP

[57] ABSTRACT

Junction-type field-effect transistors are disclosed exhibiting improved resistance to impact ionization. A p-type gate region is formed above an n-type channel region between an n-type drain region and an n-type source region each having a high impurity concentration. The impurity concentration in the vicinity of a point on a boundary between the channel region and the drain region is higher than the impurity concentration in the vicinity of a point on a boundary between the channel region and the source region. The impurity concentration in the channel region can increase essentially linearly or stepwise from the source region to the drain region. The pinch-off point is shifted toward the source side, and the electric field intensity in the boundary region between the channel region and the drain region is relatively low to inhibit impact ionization.

10 Claims, 6 Drawing Sheets

JUNCTION-TYPE FIELD-EFFECT TRANSISTOR WITH IMPROVED IMPACT-IONIZATION RESISTANCE

FIELD OF THE INVENTION

This invention relates to junction-type field-effect transistors, particularly to junction-type field-effect transistors having improved resistance to impact ionization.

BACKGROUND OF THE INVENTION

Junction-type field-effect transistors (abbreviated "JFETs") exhibit less 1/f noise ("flicker noise") arising from the surface level, and exhibit a smaller substrate bias effect than MOS-type FETs. Since JFETs have a higher gate input impedance than bipolar transistors, JFETs are preferred for use as amplifiers or the like in analog circuits that require low noise and high gain.

A conventional JFET is shown in FIG. 8, in which a p-type gate region 102 is situated on the surface of an n-type semiconductor substrate. On one side of the p-type gate region 102 is an n-type drain region 103 having a high concentration of impurity, and on the opposing side of the p-type gate region 102 is an n-type source region 104 having a high concentration of impurity. An n-type channel region 105, situated beneath the gate region 102, serves to connect the source region 104 to the drain region 103. A p-type back-gate region 106 is situated beneath the channel region 105, the source region 104, and the drain region 103. The back-gate region 106 is electrically connected to the gate region 102. (Electrodes, insulating films between certain layers, and the like are not shown in FIG. 8).

In conventional JFETs, the concentration profile of impurity (here n-type) in the channel region 105 is essentially constant in a region extending from the source region 104 to the drain region 103. Also, the concentration of impurity in the source region 104 and the concentration of impurity in the drain region 103 are essentially equal. In other words, in FIG. 8, an imaginary line parallel to the surface of the semiconductor substrate can be drawn connecting a point Q inside the drain region 103, a point R on the boundary between the drain region 103 and the channel region 105, a point S on the boundary between the channel region 105 and the source region 104, and a point T inside the source region 104. The concentration distribution of n-type impurity on this line can be depicted as the curve 112 shown in FIG. 10. In FIG. 10, the horizontal axis represents positions along the imaginary straight line connecting the points Q, R, S, and T, and the vertical axis represents the impurity concentration (per cubic centimeter). As indicated by the curve 112, the impurity concentration in the drain region 103 and the source region 104 is high (at level $C_D$). The impurity concentration drops precipitously toward the channel region 105 near the boundary between the drain region 103 and the channel region 105 and near the boundary between the source region 104 and the channel region 105. The impurity concentration distribution in the channel region 105 from point R to point S is essentially uniformly low (at level $C_S$). Infusion of impurity in the channel region 105 is usually performed from the upper surface of the n-type semiconductor substrate. As a result, the impurity concentration in the channel region 105 may vary vertically to some extent.

In conventional JFETs having a structure like that shown in FIG. 8, a gate-source voltage $V_{gs}$ of inverse bias is applied across the gate region 102 and the source region 104 while a prescribed drain-source voltage $V_{ds}$ is applied so that a carrier will flow between the drain region 103 and the source region 104. The widths of the depletion layers 111 and 108 situated between a first diffusion region consisting of the drain region 103, the channel region 105, and a second source region 104, and a second diffusion region consisting of the gate region 102 and the back gate region 106 are controlled by the gate-source voltage $V_{gs}$. Thus, the current flowing between the source and the drain is controlled.

As stated above, the bias of the gate-source voltage $V_{gs}$ is inverted. The drain-source voltage $V_{ds}$ is usually sufficient to allow a carrier to flow from the source to the drain. Hence, if the source voltage is zero, then $V_{gs}<0$ and $V_{ds}>0$ in the n-type JFET. If the voltage between the gate region 102 and the drain region 103 is equal to the gate-drain voltage $V_{gd}$, then the relation $|V_{gd}|>|V_{gs}|$ holds since $V_{gd}=V_{gs}-V_{ds}$. These conditions cause the depletion layers 108 and 111 to become thick on the drain region 103 side.

As shown in FIG. 8, as the drain-source voltage $V_{ds}$ is gradually increased from zero volts, the depletion layer 108 on the back gate region 106 side and the depletion layer 111 on the gate region 102 side are brought into contact. The point at which the depletion layer 108 and the depletion layer 111 actually contact each other on the drain region 103 side is called the "pinch-off point" 109. As the drain-source voltage $V_{ds}$ is further increased, the pinch-off point 109 is shifted to the drain region 103 side as shown in FIG. 9.

The difference in voltage between the drain region 103 and the pinch-off point 109 is determined by the impurity-concentration profile and the thickness of the channel region 105. Consequently, even if the pinch-off point 109 is shifted as the drain-source voltage $V_{ds}$ is increased, the voltage difference between the drain region 103 and the pinch-off point 109 in a typical conventional JFET remains constant.

In conventional JFETs (e.g., FIG. 9), if the drain-source voltage $V_{ds}$ is further increased, the pinch-off point 109 is further shifted toward the drain region 103, decreasing the distance between the pinch-off point 109 and the drain region 103 and increasing the electric field strength peripherally about the drain region 103. If the electric field strength rises above a threshold, impact ionization occurs at the periphery of the drain region 103. Impact ionization generates a charge that flows into the gate region 102 with high current. The drain-source voltage $V_{ds}$ should be limited so as to prevent occurrence of such a phenomenon.

Modern semiconductor devices preferably satisfy strict requirements with respect to miniaturization. To meet such requirements, the gate length (i.e., the distance between the source region 104 and the drain region 103) should be small. However, shortening the gate length decreases the distance between the pinch-off point 109 and the drain region 103. This causes an increase in electric-field strength, with a corresponding undesirable increase in the probability of impact ionization. In order to suppress impact ionization, the drain-source voltage $V_{ds}$ should be low; however, this reduces the resistance of the semiconductor against impact ionization.

SUMMARY OF THE INVENTION

In view of the shortcomings discussed above, an object of the present invention is to provide a junction-type field-effect transistor (JFET) with an increased resistance to impact ionization and optionally a decreased gate length, compared to conventional JFETs.

According to one aspect of the invention, a junction-type field-effect transistor (JFET) is provided that comprises, on a semiconductor substrate, a gate region, a source region, a drain region, a channel region, and a back-gate region. The gate region is on a surface of the substrate. The source region and drain region flank the gate region. The channel region is located beneath the gate region and connects the source and drain regions. The channel region has a higher concentration of impurity adjacent the drain region than adjacent the source region. The back-gate region is located beneath the channel region and is electrically connected to the gate region.

The gate region can be p-type, with the source region being n-type, the drain region n-type, and the back-gate region p-type. Alternatively, the gate region can be n-type, with the source region being p-type, the drain region p-type, and the back-gate region n-type. The concentration of impurity in the source and drain regions is preferably equal.

The channel region can comprise a low-concentration channel region (containing a relatively low concentration of impurity) and a high-concentration region (containing a high concentration of impurity relative to the low-concentration region). The low-concentration channel region is preferably adjacent the source region and the high-concentration channel region is preferably adjacent the drain region. At a boundary between the low-concentration channel region and the high-concentration channel region, the concentration profile of impurity preferably changes stepwise. The impurity concentration in the high-concentration channel region is preferably 1.5× to 3× the impurity concentration in the low-concentration channel region.

Alternatively, the concentration of impurity can change linearly from the source region to the drain region. In such an instance, the impurity concentration in the channel region adjacent the drain region is preferably 1.5× to 3× the impurity concentration in the channel region adjacent the source region.

In any event, as a result of the variable concentration of impurity across the channel region, whenever a bias voltage is applied between the source and drain regions, a depletion region forms that is more easily extended on the source side than on the drain side. As a result, a pinch-off point is shifted toward the source region, and the distance between the pinch-off point and the drain region becomes relatively elongated. This weakens the electric field in the vicinity of the pinch-off point. Even if the distance between the source region and the drain region (i.e., the "gate length") is shortened, impact ionization is inhibited.

As the impurity concentration on the drain side is increased relative to the source side (up to the 3× limit mentioned above), more drain-source voltage $V_{ds}$ is distributed to the source side. As a result, the electric potential gradient in the vicinity of the pinch-off point (that has been displaced toward the source side) increases.

The foregoing and additional features and advantages of the invention will be more readily apparent from the following detailed description, which proceeds with reference to the accompanying drawings.

DETAILED DESCRIPTION OF THE INVENTION

Details of junction-type field-effect transistors (JFETs) according to the present invention are described below in connection with multiple example embodiments that represent the current best mode of the invention.

Example Embodiment 1

Figure 1:
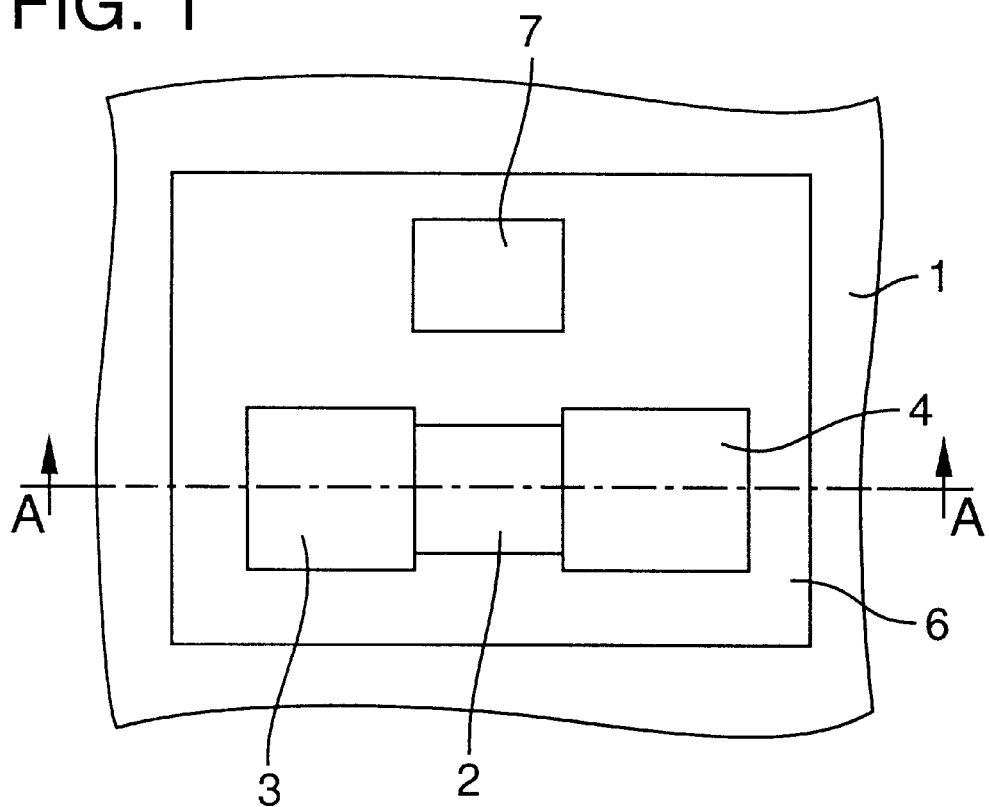
FIG. 1 is a schematic plan view of a junction-type field-effect transistor (JFET) according to Example Embodiment 1 of the present invention.
Figure 2:
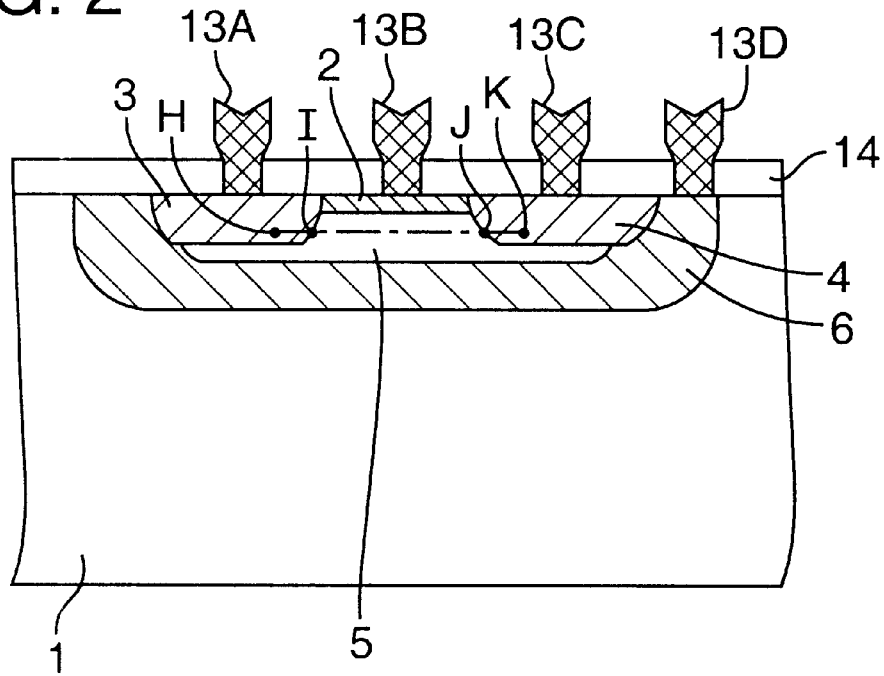
FIG. 2 is an elevational sectional view, along the line A—A, of the JFET shown in FIG. 1.
Figure 3:
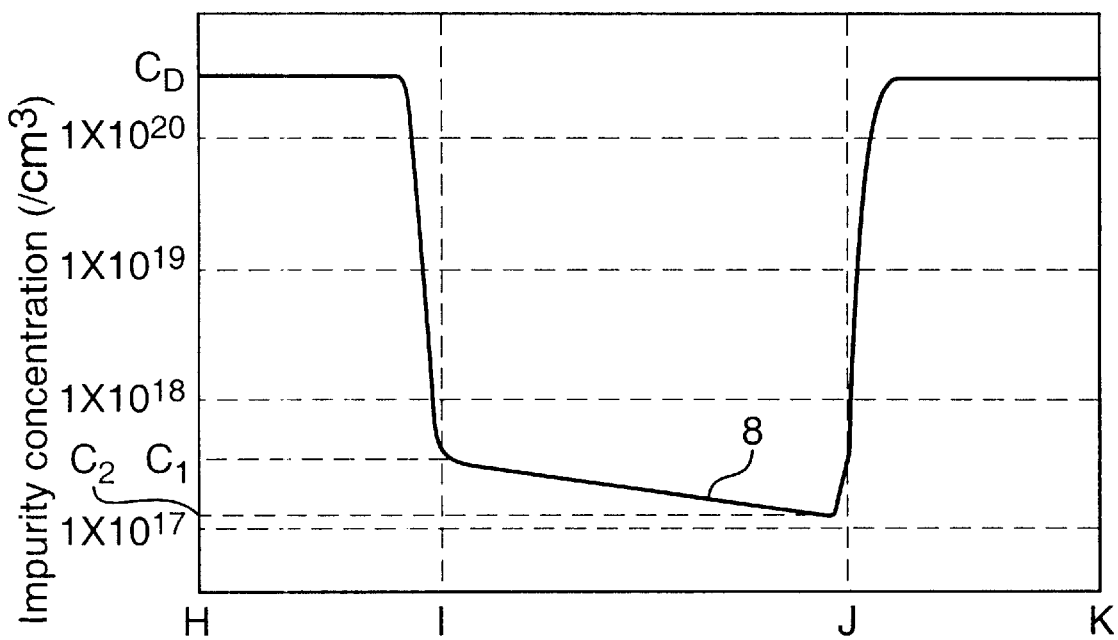
FIG. 3 is a plot of impurity concentration along a straight line passing through the channel region from point H to point K in FIG. 2.

Aspects of a JFET according to this example embodiment are shown in FIGS. 1–3. In this example embodiment, the channel region is described as n-type and the gate region is described as p-type. However, it will be understood that the channel region can be formed as p-type and the gate region can be formed as n-type without altering the general configuration of the transistor.

FIG. 1 is a schematic plan view of a JFET according to this example embodiment, and FIG. 2 is an elevational sectional view (along the line A—A) of the JFET of FIG. 1.

The JFET comprises a gate region 2 formed on a surface of an n-type silicon substrate 1. The gate region 2 is formed by introducing a p-type impurity such as boron (B), gallium (Ga), indium (In), or the like into the surface of the substrate 1. A source region 4, flanking one side of the gate region 2, is formed by introducing an n-type impurity such as arsenic (As), phosphorus (P), antimony (Sb), or the like at high concentration into the substrate 1. A drain region 3 is formed flanking the opposing side of the gate region relative to the source region 4; thus, the gate region 2 is situated between the drain region 3 and the source region 4. If the source region is n-type, then the drain region is also n-type.

As shown in FIG. 2, an n-type channel region 5 is formed beneath the gate region 2 so as to form a connection between the source region 4 and the drain region 3. A p-type back-gate region 6 is formed beneath the channel region and preferably surrounding the lower surface of the channel region 5, the source region 4, and the drain region 3. The back-gate region 6 is electrically connected to the gate region 2 on the surface of the JFET. An inter-layer insulating film 14 is formed on the surface of the silicon substrate 1. Electrodes 13A, 13B, 13C, and 13D (not shown in FIG. 1) extend through the insulating film 14 to the drain region 3, gate region 2, source region 4, and back-gate region 6, respectively. The electrode 13D is preferably connected to a high-concentration p-type dispersion region 7 (FIG. 1) formed on the surface of the back-gate region 6. An electrode (not shown) is connected to the silicon substrate 1. Wires (not shown) are connected to each of the electrodes.

The concentration distribution of impurity in the channel region 5 increases essentially linearly from the source region 4 to the drain region 3. In FIG. 2, an imaginary straight line extending parallel to the surface of the silicon substrate 1 through a point H inside the drain region 3, a point I on the boundary between the drain region 3 and the channel region 5, a point J on the boundary between the source region 4 and the channel region 5, and a point K inside the source region 4 defines a concentration distribution of n-type impurity as denoted by the curve 8 shown in FIG. 3. In FIG. 3, the abscissa represents positions along the straight line HIJK, and the ordinate represents the impurity concentration (per cubic centimeter). (Numerical values indicated on the ordinate of FIG. 3 are discussed below.)

The curve 8 indicates that the concentration of n-type impurity remains at a high level $C_D$ in the source region 4 and the drain region 3. The impurity concentration changes abruptly in the channel region 5 near the boundary between the source region 4 and the channel region 5 and near the boundary between the drain region 3 and the channel region 5. The impurity concentration $C_1$ near the point I (on the boundary between the drain region 3 and the channel region 5) is larger than the impurity concentration $C_2$ near the point J (on the boundary between the source region 4 and the channel region 5). The impurity concentration inside the channel region 5 increases essentially linearly from near the point J on the source side to near the point I on the drain side. Preferably, the impurity concentration midway across the channel region 5 is approximately equal to the mean impurity concentration in the channel region of a conventional JFET.

Figure 8:
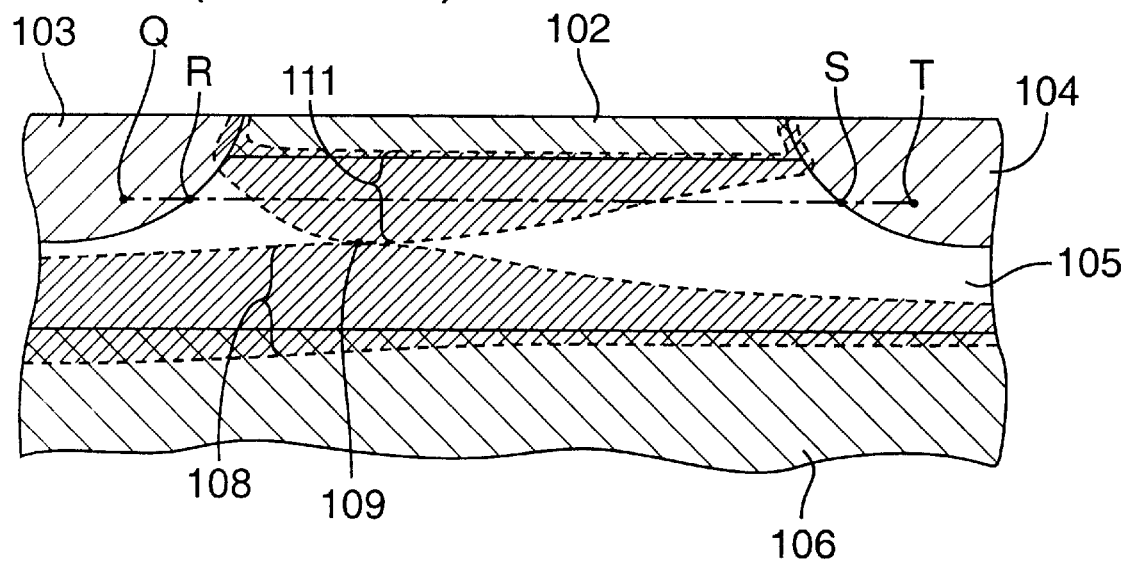
FIG. 8 is a schematic elevational section of a conventional JFET.
Figure 9:
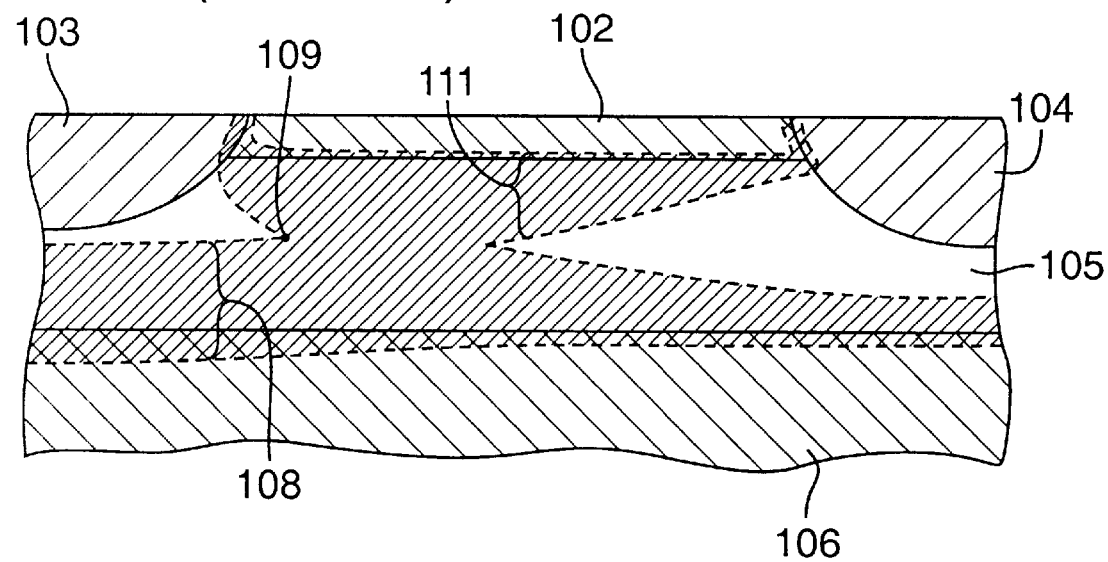
FIG. 9 is a schematic elevational section showing a conventional JFET in a state in which the depletion layer extends out farther than shown in FIG. 8j.

With a JFET according to this example embodiment, the electric current flowing between the source and the drain is controlled by controlling the width of the depletion layers in the channel region 5. This is accomplished by applying a gate-source voltage $V_{gs}$ representing a reverse bias between the gate region 2 and the source region 4 while applying a drain-source voltage $V_{ds}$ between the drain region 3 and the source region 4. Meanwhile, the impurity concentration in the channel region 5 is higher than the impurity concentration near the drain region of a conventional JFET, and lower than the impurity concentration near the source region 4 of a conventional JFET. Application of a turn-on voltage $V_{th}$ (such as a voltage equal to a turn-on voltage applied to a conventional JFET such as that shown in FIG. 8) to the JFET of this example embodiment forms a depletion layer that is less likely to be extended to the drain region 3 than in the conventional JFET. Also, the depletion layer of the JFET of this example embodiment near the source region 4 is more likely to be extended than the depletion layer of a conventional JFET.

Therefore, the pinch-off point on the drain side of the JFET according to this example embodiment is displaced a greater distance toward the source 4 than the pinch-off point on the drain side of the conventional JFET. The distance from the pinch-off point to the drain 3 of the JFET of this example embodiment is longer than in a conventional JFET. This weakens the electric field in the vicinity of the pinch-off point and reduces the likelihood of impact ionization compared with the conventional JFET.

In FIG. 3, it is preferred that the concentration $C_1$ of n-type impurity in the channel region 5 near the point I on the boundary between the drain region 3 and the channel region 5 be 1.5× to 3× the concentration $C_2$ in the vicinity of the point J on the boundary between the source region 4 and the channel region 5. If $C_1 < 1.5(C_2)$, then satisfactory suppression of impact ionization is not achievable.

As the concentration $C_1$ is increased relative to the concentration $C_2$, the distribution of the drain-source voltage $V_{ds}$ is more skewed to the source side. This causes an increase in the potential gradient (in the vicinity of the pinch-off point) displaced toward the source side. If $C_1 > 3(C_2)$, then the potential gradient (in the vicinity of the pinch-off point) is sufficiently large to favor impact ionization.

A JFET according to this example embodiment is manufactured according to a method as shown in FIGS. 6(a)–6(e) that schematically depict elevational sections of the silicon substrate 1 at each of various stages of the process.

Figure 6A:
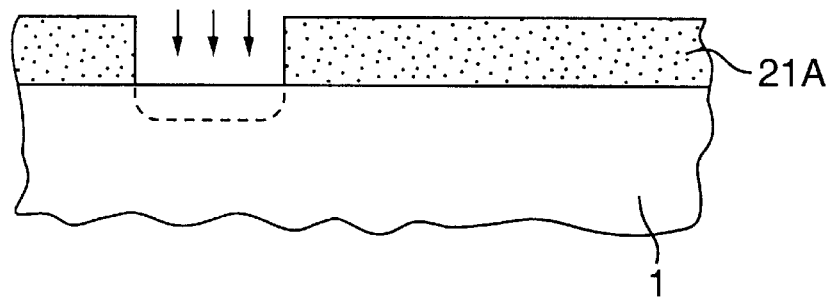
FIGS. 6(a)–6(e) are schematic sectional views showing the results of certain steps of a process for manufacturing a JFET according to Example Embodiment 1 of the present invention.

In a first step as shown in FIG. 6(a), the surface of the silicon substrate 1 (except for regions destined to become drain regions) is covered with a resist film 21A using photolithography. An n-type impurity is infused depthwise into the silicon substrate 1 by, e.g., low-energy ion bombardment using the resist membrane 21A as a mask.

Figure 6B:
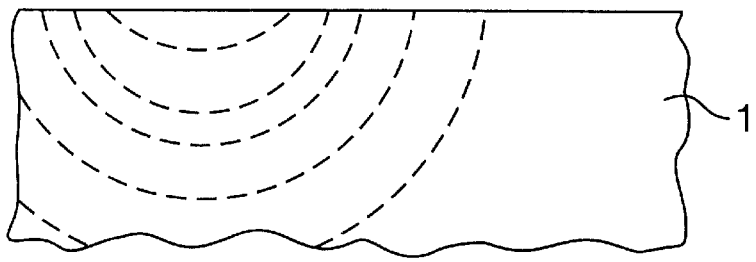

In a second step as shown in FIG. 6(b), the infused impurity ions are thermal-diffused to form a continuous concentration gradient of the n-type impurity inside the regions destined to become the channel regions.

Figure 6C:
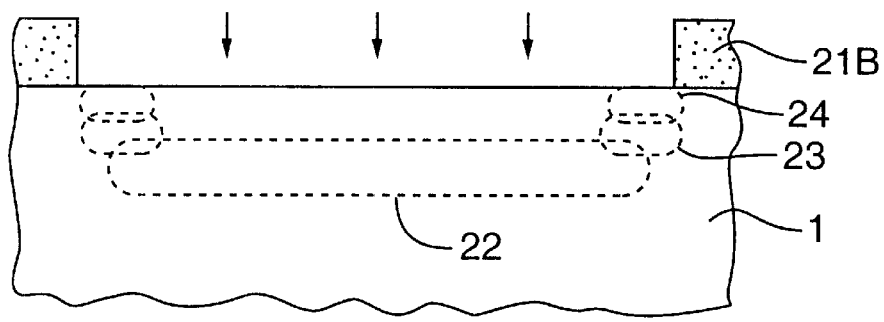

In a third step as shown in FIG. 6(c), the entire surface of the n-type silicon substrate 1 (except for regions destined to become back-gate regions) is covered with a resist film 21B using, e.g., photolithography. A p-type impurity is infused depthwise into a region 22 by, e.g., high-energy ion bombardment using the resist film 21B as a mask. A new resist film 21B is applied and a p-type impurity is infused depthwise into selected regions 23 (as defined by openings in the new resist film) by, e.g., intermediate-energy ion bombardment. The regions 23 are situated above respective edges of the region 22. In addition, a p-type impurity is infused by, e.g., low-energy ion bombardment into regions 24 situated closer to the upper surface of the silicon substrate 1 than the regions 23. Thus, the back-gate region 6, as shown in FIG. 6(d), is formed.

Figure 6D:
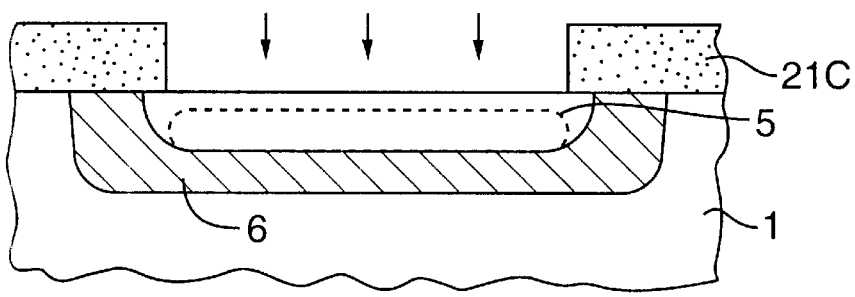

In a fourth step as shown in FIG. 6(d), the entire surface of the silicon substrate 1 (except for regions destined to become channel regions) is covered with a resist film 21C using, e.g., photolithography. Using the resist film 21C as a mask, an n-type impurity is infused into the interior of the silicon substrate 1 by, e.g., intermediate-energy ion bombardment to form the channel regions 5.

Figure 6E:
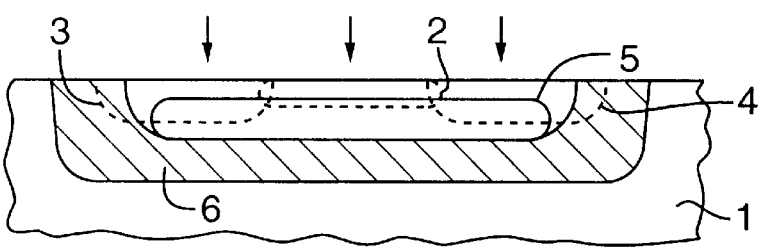

Next, as shown in FIG. 6(e), a high concentration of an n-type impurity is infused by, e.g., low-energy ion bombardment into regions destined to become the drain region 3 and the source region 4, and a high concentration of a p-type impurity is infused by, e.g., low-energy ion bombardment into regions destined to become the gate regions 2, and anneal the substrate to activate the impurities electrically. Afterward, the electrodes are formed, thus completing the process for manufacturing the JFET.

The JFET according to this example embodiment exhibits a profile of impurity concentration as shown by the curve 8 in FIG. 3, in which the impurity concentration increases linearly in the channel region from the source region to the drain region.

Example Embodiment 2

Figure 4:
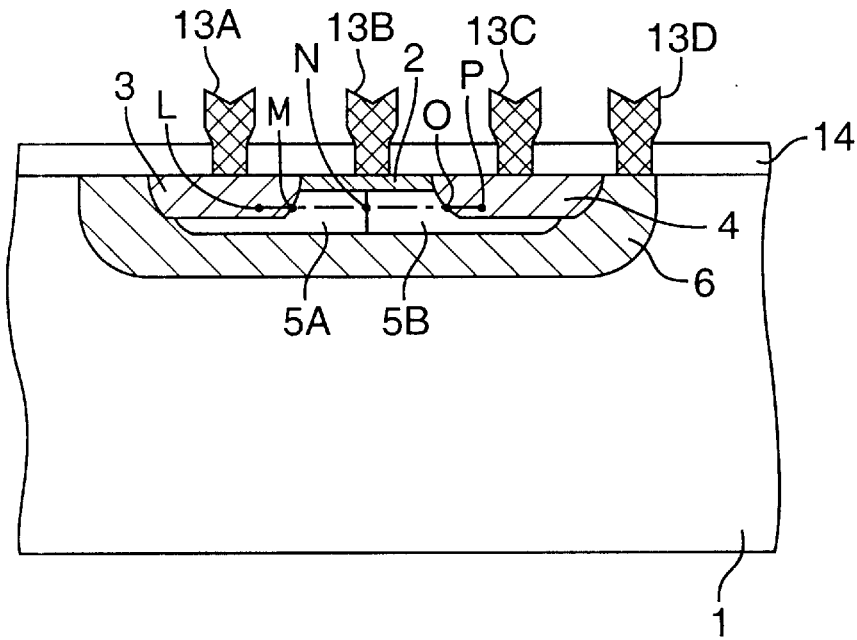
FIG. 4 is an elevational sectional view schematically depicting the configuration of a JFET according to Example Embodiment 2 of the present invention.
Figure 5:
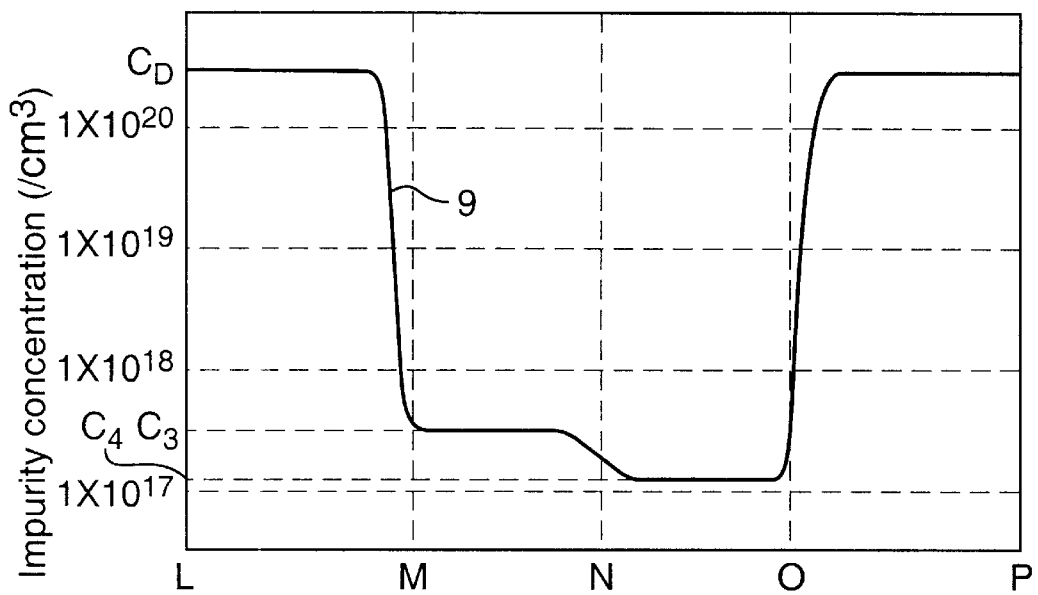
FIG. 5 is a plot of impurity concentration along a straight line passing through the channel region from point L to point P in FIG. 4.

A JFET according to this example embodiment is depicted in FIGS. 4 and 5. The JFET according to this example embodiment is similar to the JFET of Example Embodiment 1 except that the channel region of the JFET of Example Embodiment 2 comprises two regions. In FIG. 4, features that are the same as shown in FIG. 2 have the same reference numerals and are not described further.

FIG. 4 schematically shows the channel region divided into a low-concentration channel region 5B (in which the concentration of n-type impurity is relatively low) and a high-concentration channel region 5A (in which the concentration of n-type impurity is higher than in the low-concentration channel region 5B). The low-concentration channel region 5B is adjacent the source region 4, and the high-concentration channel region 5A is adjacent the drain region 3. Other features of the FIG. 4 embodiment are the same as shown in FIG. 2.

In the JFET of this example embodiment, the concentration profile of n-type impurity in the channel region changes stepwise in the boundary region between the high-concentration channel region 5A and the low-concentration channel region 5B. In FIG. 4, an imaginary straight line can be drawn parallel to the surface of the silicon substrate 1 and passing through a point L inside the drain region 3, a point M on the boundary between the drain region 3 and the high-concentration channel region 5A, a point N on the boundary between the high-concentration channel region 5A and the low-concentration channel region 5B, a point O on the boundary between the low-concentration channel region 5B and the source region 4, and a point P inside the source region 4. The concentration profile of n-type impurity along this straight line can be depicted as the curve 9 shown in FIG. 5.

In FIG. 5, the abscissa represents positions along the straight line connecting the points L, M, N, O, and P of FIG. 4, and the ordinate represents impurity concentration per cubic centimeter. The numerical values plotted on the ordinate in FIG. 5 described later below. As indicated by the curve 9, the concentration of n-type impurity remains at a high level $C_D$ in the source region 4 and in the drain region 3. Along the line from the drain region 3 to the high-concentration channel region 5A, the impurity concentration exhibits an abrupt decline from the level $C_D$ near the boundary between the drain region 3 and the high-concentration channel region 5A. Similarly, along the line from the low-concentration channel region 5B to the source region 4, the impurity concentration exhibits an abrupt rise back to the level $C_D$. The impurity concentration in the high-concentration channel region 5A is essentially constant at a level $C_3$, and is essentially constant at a level $C_4$ (wherein $C_4<C_3$) in the low-concentration channel region 5B. The mean of the impurity concentrations $C_3$ and $C_4$ is approximately the same as the impurity concentration in the channel region of a conventional JFET. The impurity concentration $C_3$ on the drain side is preferably 1.5× to 3× the impurity concentration $C_4$ on the source side.

Substantially as in Example Embodiment 1, the pinch-off point of the JFET of Example Embodiment 2 is shifted toward the source region by a greater distance than in a conventional JFET. As a result, the electric field in peripheral portions of the drain region is weak, which suppresses impact ionization.

A JFET according to this example embodiment can be manufactured according to a process as described below and shown in FIGS. 7(a)–7(b). The following description is especially directed to forming the high-concentration channel region 5A and the low-concentration channel region 5B. Other aspects of the process are as described above with respect to FIGS. 6(a)–6(e).

Figure 7A:
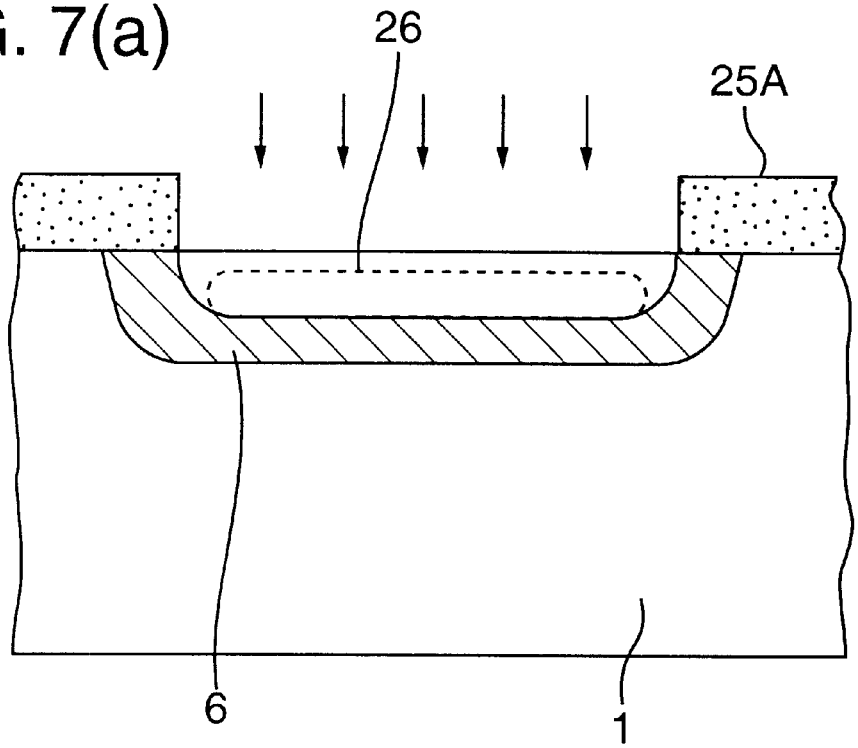
FIGS. 7(a)–7(b) are schematic sectional views showing the results of certain steps of a process for manufacturing a JFET according to Example Embodiment 2 of the present invention.
Figure 7B:
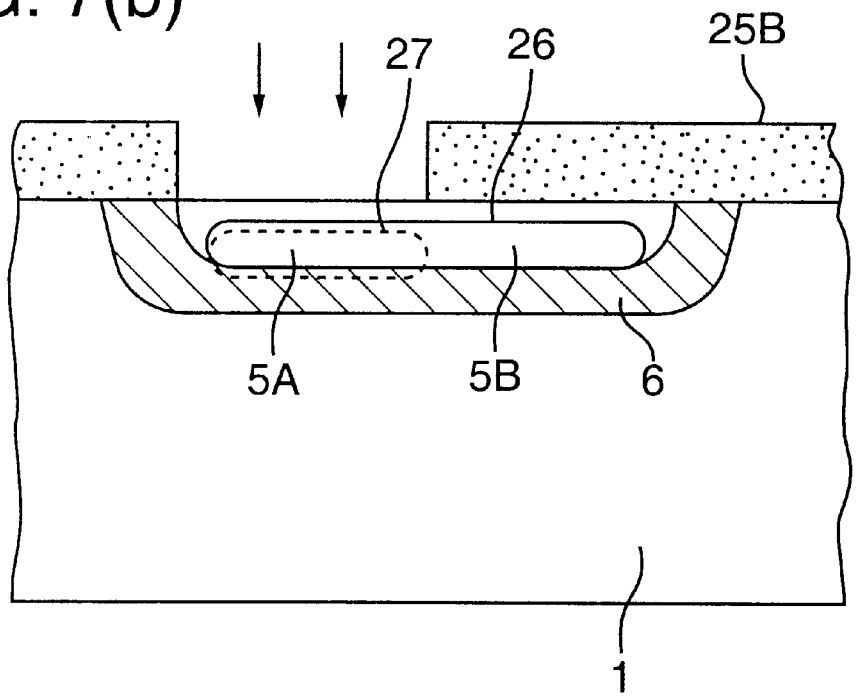

FIGS. 7(a)–7(b) depict elevational sections of the substrate of the JFET of FIG. 4 at certain steps in the manufacturing process. FIG. 7(a) depicts a situation in which the back-gate region 6 already has been formed in the interior of the n-type silicon substrate 1, preferably by ion bombardment as explained above with reference to FIG. 6(c). To form a region for infusing an n-type impurity of low concentration in the back-gate region 6, the entire surface of the n-type silicon substrate 1 (except for regions destined to become channel regions) is covered with a resist film 25A using, e.g., photolithography. The n-type impurity is infused into the silicon substrate 1 by, e.g., intermediate-energy ion bombardment using the resist film 25A as a mask. Thus, the low-concentration diffusion region 26 is formed (FIG. 7(a)).

Afterward, the resist film 25A is removed. As shown in FIG. 7(b), the entire surface of the n-type silicon substrate 1 (except for the left half of the diffusion region 26) is covered with a resist film 25B using, e.g., photolithography. More n-type impurity is infused into the silicon substrate 1 by, e.g., ion bombardment using the resist film 25B as a mask. Thus, a new n-type diffusion region 27 is formed.

Through the foregoing process, the region at the intersection of the diffusion regions 26 and 27 becomes the high-concentration channel region 5A, and the remainder of the diffusion region 26 (not intersecting the diffusion region 27) becomes the low-concentration channel region 5B.

Next, by forming the drain region, the source region, and the gate region by ion bombardment or analogous technique, the process for making the JFET of FIG. 4 is completed. Thus, according to the present embodiment, a profile of impurity concentration is formed that defines two steps in the channel region (similar to that shown by the curve 9 of FIG. 5). The concentration profile is easily formed since impurities are injected in two stages into the region that is to become the channel region.

Working Example 1

This working example is directed to making a JFET according to Example Embodiment 1. A p-type gate region 2 with an impurity concentration of $5\times10^{17}$ cm$^{-3}$ and a diffusion depth 0.2 μm was formed on the surface of an n-type silicon substrate 1 having a specific resistance from 4 to 6 Ω·cm. A drain region 3 and a source region 4 having an impurity concentration of $5\times10^{20}$ cm$^{-3}$ and a diffusion depth of 0.4 μm were formed such that the gate region 2 resided between them. The distance between the drain region 3 and the source region 4, (i.e., the gate length) was set to 1.4 μm. An n-type channel region 5, having an impurity concentration profile as shown in FIG. 3, was formed underneath the gate region 2. The impurity concentration $C_1$ in the vicinity of the point I (located on the boundary between the channel region 5 and the drain region 3) and the impurity concentration $C_2$ in the vicinity of the point J (located on the boundary between the channel region 5 and the source region 4) were each in the range of $1\times10^{17}$ to $1\times10^{18}$ cm$^{-3}$, wherein the concentration $C_1$ was approximately twice the concentration $C_2$. A p-type back gate region 6 having an impurity concentration of $5\times10^{17}$ cm$^{-3}$ was formed underneath the channel region 5. The distance between the gate region 2 on the surface of the silicon substrate 1 and the back gate 6 (i.e., the thickness of the channel region 5) was 0.3 μm. In a JFET according to this working example, the drain-source voltage $V_{ds}$ (measured when the gate current $I_g$ due to impact ionization was 1 pA) was approximately 4 V.

Figure 10:
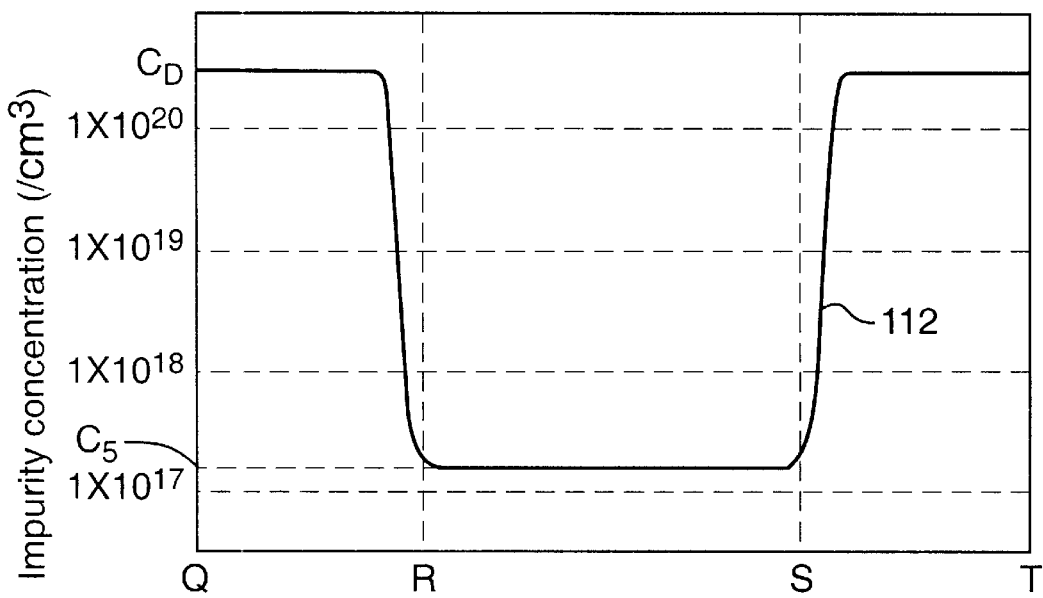
FIG. 10 is a plot of impurity concentration along a line extending longitudinally across the channel region of a conventional JFET.

To compare the performance of a JFET according to this working example with a conventional JFET, a characteristics measurement was performed on two conventional JFETs manufactured to the following specifications. Both conventional JFETs had the same $V_{th}$ (turn-on voltage), gate-region impurity concentration, gate-region diffusion depth, channel-region thickness, and the like, as a JFET according to Example Embodiment 1. Both conventional JFETs had a flat impurity-concentration profile in the channel region, as shown in FIG. 10. One of the two conventional JFETs had a gate length of 5 μm, and the other had a gate length of 1.4 μm. When the gate current $I_g$ became 1 pA due to impact ionization, the drain-source voltage $V_{ds}$ of the conventional JFET with the gate length of 5 μm was 7 V, and the drain-source voltage $V_{ds}$ of the other conventional JFET with the gate length of 1.4 μm was 2 V. Thus, a JFET according to Example Embodiment 1 has an impact ionization resistance that is approximately 2× higher than the impact-ionization resistance of a conventional JFET.

Working Example 2

A JFET according to Example Embodiment 2 (FIG. 4) was manufactured as described above. The concentration of n-type impurity in the high-concentration channel region 5A and in the low-concentration channel region 5B (constituting the channel regions of the JFET shown in FIG. 4) exhibited a stepwise change indicated by the curve 9 of FIG. 5. Specifically, the impurity concentration $C_3$ in the high-concentration channel region 5A and the impurity concentration $C_4$ in the low-concentration channel region 5B were in the range $1\times10^{17}$ to $1\times10^{18}$ cm$^{-3}$, wherein the concentration $C_3$ was approximately 2× the concentration $C_4$. The drain-source voltage $V_{ds}$, measured when the gate current $I_g$ due to impact ionization was 1 pA, was approximately 4 V as in the case of Example Embodiment 1. Thus, it can be seen that a JFET made according to Example Embodiment 2 has a resistance to impact ionization that is approximately 2× greater than the resistance to impact ionization of a conventional JFET.

In a JFET according to the present invention, the impurity concentration in the channel region is such that the concentration will be relatively high on the drain-region side and low on the source-region side. Hence, the depletion layer on the source side is more easily extended than the depletion layer on the drain side whenever a drain-source voltage or a gate-source voltage is applied to the JFET. Under such conditions, the distance between the pinch-off point and the drain region increases and the electric field becomes weaker, thereby improving resistance against impact ionization. The distance between the drain region and the source region (i.e., the gate length) can be more shortened than with conventional JFETs, thereby allowing greater miniaturization of JFETs according to the present invention without increasing susceptibility to impact ionization.

Excellent JFET device characteristics can be achieved when the impurity concentration in the channel region exhibits a gradual but continuous increase from the source side to the drain side. This produces a smooth carrier flow in the channel region.

If the impurity concentration in the channel region exhibits a stepwise change from the source side to the drain side, similar advantageous device characteristics can be achieved as described above, with a simplification of the device manufacturing process.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A junction-type field-effect transistor, comprising on a semiconductor substrate:

(a) a gate region on a surface of the substrate;

(b) a source region flanking the gate region;

(c) a drain region flanking the gate region opposite the source region;

(d) a channel region located beneath the gate region and connecting the source and drain regions, the channel region having a higher concentration of impurity adjacent the drain region than adjacent the source region; and (e) a back-gate region located beneath the channel region and electrically connected to the gate region.

2. The junction-type field-effect transistor of claim 1, wherein the substrate is n-type, the gate region is p-type, the source region is n-type, the drain region is n-type, and the back-gate region is p-type.

3. The junction-type field-effect transistor of claim 1, wherein the concentration of impurity in the drain and source regions is equal.

4. The junction-type field-effect transistor of claim 1, wherein the channel region comprises a low-concentration channel region and a high-concentration channel region adjacent the low-concentration channel region, the low-concentration channel region being adjacent the source region and the high-concentration channel region being adjacent the drain region.

5. The junction-type field-effect transistor of claim 4, wherein the concentration profile of impurity changes stepwise on a boundary between the high-concentration channel region and the low-concentration channel region.

6. The junction-type field-effect transistor of claim 1, wherein the impurity concentration in the channel region increases linearly from a boundary of the channel region with the source region to a boundary of the channel region with the drain region.

7. The junction-type field-effect transistor of claim 1, wherein the impurity concentration in the channel region increases stepwise from a boundary of the channel region with the source side to a boundary of the channel region with the drain region.

8. The junction-type field-effect transistor of claim 7, wherein the impurity concentration on a drain side of the channel region is 1.5× to 3× the impurity concentration on a source side of the channel region.

9. The junction-type field-effect transistor of claim 6, wherein the impurity concentration on a drain side of the channel region is 1.5× to 3× the impurity concentration on a source side of the channel region.

10. The junction-type field-effect transistor of claim 1, wherein the impurity concentration on a drain side of the channel region is 1.5× to 3× the impurity concentration on a source side of the channel region.

* * * * *

UNITED STATES PATENT AND TRADEMARK OFFICE
CERTIFICATE OF CORRECTION

PATENT NO.     : 6,020,608

DATED          : February 1, 2000

INVENTOR(S)    : Atsushi Kamashita

It is certified that errors appear in the above-identified patent and that said Letters Patent is hereby corrected as shown below:

In Column 7, line 35-36, "The numerical values plotted on the ordinate in FIG. 5 described later below." should read --The numerical values plotted on the ordinate in FIG. 5 are described later below.--.

Signed and Sealed this

Eighth Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO.   : 6,020,608
DATED        : February 1, 2000
INVENTOR(S)  : Atsushi Kamashita It is certified that error appears in the above-identified patent and that said Letters Patent is hereby corrected as shown below:

Column 7,
Lines 35-36, "The numerical values plotted on the ordinate in FIG. 5 described later below." should read -- The numerical values plotted on the ordinate in FIG. 5 are described later below. --.

Signed and Sealed this

Tenth Day of May, 2005

JON W. DUDAS
*Director of the United States Patent and Trademark Office*